(12) United States Patent
Morino et al.

(10) Patent No.: US 8,844,134 B2
(45) Date of Patent: Sep. 30, 2014

(54) METHOD OF MANUFACTURING A HEAT EXCHANGER

(75) Inventors: Masahiro Morino, Okazaki (JP); Yasuji Taketsuna, Okazaki (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 417 days.

(21) Appl. No.: 12/937,783

(22) PCT Filed: Apr. 8, 2009

(86) PCT No.: PCT/JP2009/057542
§ 371 (c)(1),
(2), (4) Date: Oct. 14, 2010

(87) PCT Pub. No.: WO2009/128462
PCT Pub. Date: Oct. 22, 2009

(65) Prior Publication Data
US 2011/0030217 A1    Feb. 10, 2011

(30) Foreign Application Priority Data
Apr. 16, 2008 (JP) ................. 2008-106809

(51) Int. Cl.
*B21D 53/02* (2006.01)
*H01L 23/473* (2006.01)
*B23P 15/26* (2006.01)
*B22D 19/00* (2006.01)
*F28F 3/04* (2006.01)
*H01L 21/48* (2006.01)
*F28F 3/12* (2006.01)
*F28F 3/02* (2006.01)

(52) U.S. Cl.
CPC .............. *B23P 15/26* (2013.01); *H01L 23/473* (2013.01); *F28F 3/12* (2013.01); *B22D 19/00* (2013.01); *F28F 3/02* (2013.01); *F28F 3/048* (2013.01); *H01L 21/4878* (2013.01); *B23P 2700/10* (2013.01)
USPC ........................................ 29/890.03

(58) Field of Classification Search
CPC ... B23P 15/26; B23P 2700/10; H01L 23/473; H01L 23/427; H01L 23/3672; H01L 21/4882; F28F 3/12; F28F 1/022; A61L 2/0017
USPC ................ 29/890.045, 890.03; 165/104.11; 83/374–390, 451, 452
See application file for complete search history.

(56) References Cited

U.S. PATENT DOCUMENTS

| 3,168,195 | A | * | 2/1965 | Billen | .......................... 72/255 |
| 6,000,132 | A | * | 12/1999 | Butler | ...................... 29/890.03 |

(Continued)

FOREIGN PATENT DOCUMENTS

| DE | 102005043055 | * | 12/2006 | ............. 29/890.03 |
| GB | 2 278 307 | A | 11/1994 | |

(Continued)

OTHER PUBLICATIONS

Kang Sang Hoon, KR 2002-0078909 Machine Translation, Oct. 2002.*

*Primary Examiner* — David Bryant
*Assistant Examiner* — Lee Holly
(74) *Attorney, Agent, or Firm* — Kenyon & Kenyon LLP

(57) ABSTRACT

A method of manufacturing a heat exchanger. The method involves extrusion-molding a long fin member, which has a plurality of long fins protruding from a flat-plate-shaped long base, and cutting the long fin member by a predetermined width. The base of the fin members are also cut. This results in a heat exchanger having a plurality of fin members (10) including a plurality of fins (11) that is arranged in parallel and protrudes from a flat-plate base (12) so that slit portions are formed on both side ends in a width direction of the base (12), the fin members being arranged so that respective bases abut on each other in a frame.

6 Claims, 9 Drawing Sheets

(56) References Cited

U.S. PATENT DOCUMENTS

| | | | |
|---|---|---|---|
| 6,050,332 A * | 4/2000 | Smith et al. | 165/185 |
| 6,273,186 B1 * | 8/2001 | Ognibene et al. | 165/185 |
| 6,422,307 B1 * | 7/2002 | Bhatti et al. | 165/185 |
| 6,861,293 B2 * | 3/2005 | Soule | 438/122 |
| 2004/0118579 A1 | 6/2004 | McCutcheon et al. | |

FOREIGN PATENT DOCUMENTS

| | | | |
|---|---|---|---|
| GB | 2278307 A | * | 11/1994 |
| JP | 06-083243 U | | 11/1994 |
| JP | 2006-080226 A | | 3/2006 |
| JP | 2006-245479 A | | 9/2006 |
| JP | 2006-258354 A | | 9/2006 |
| JP | 2007-335588 A | | 12/2007 |
| JP | 2009-147107 A | | 7/2009 |
| JP | 2009-259925 A | | 11/2009 |
| JP | 2009-260037 A | | 11/2009 |
| KR | 2002-0078909 A | | 10/2002 |
| KR | 20020078909 A | * | 10/2002 |
| WO | 2007/006590 A2 | | 1/2007 |
| WO | 2007/028672 A1 | | 3/2007 |

\* cited by examiner

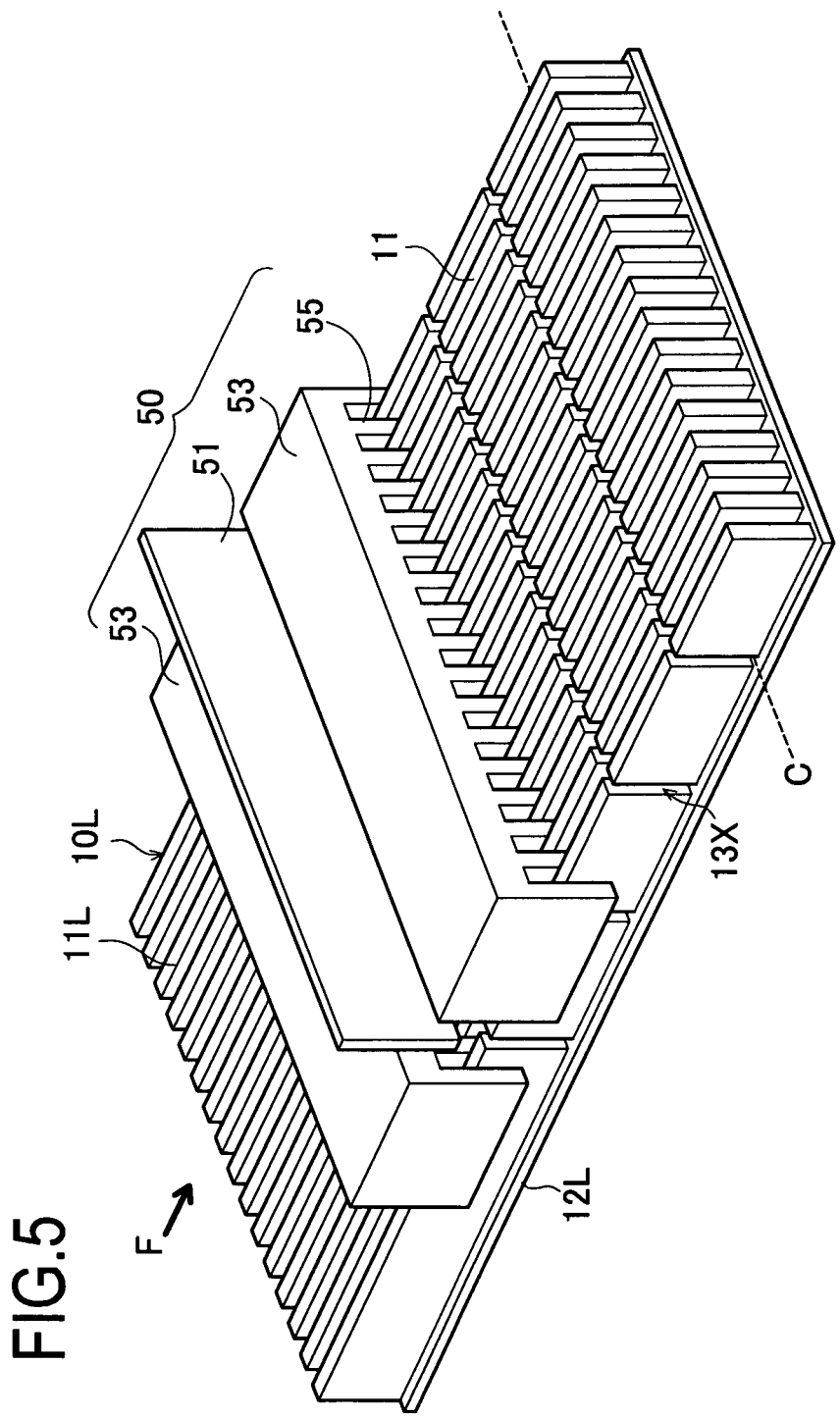

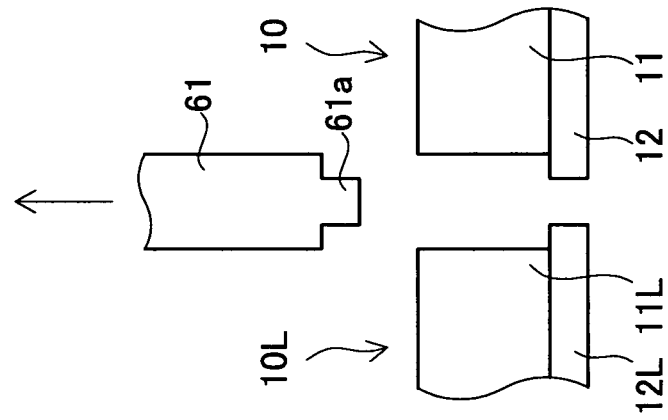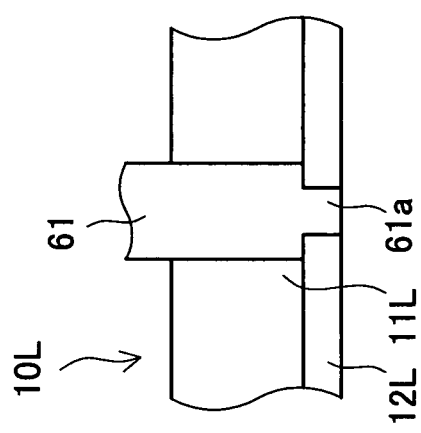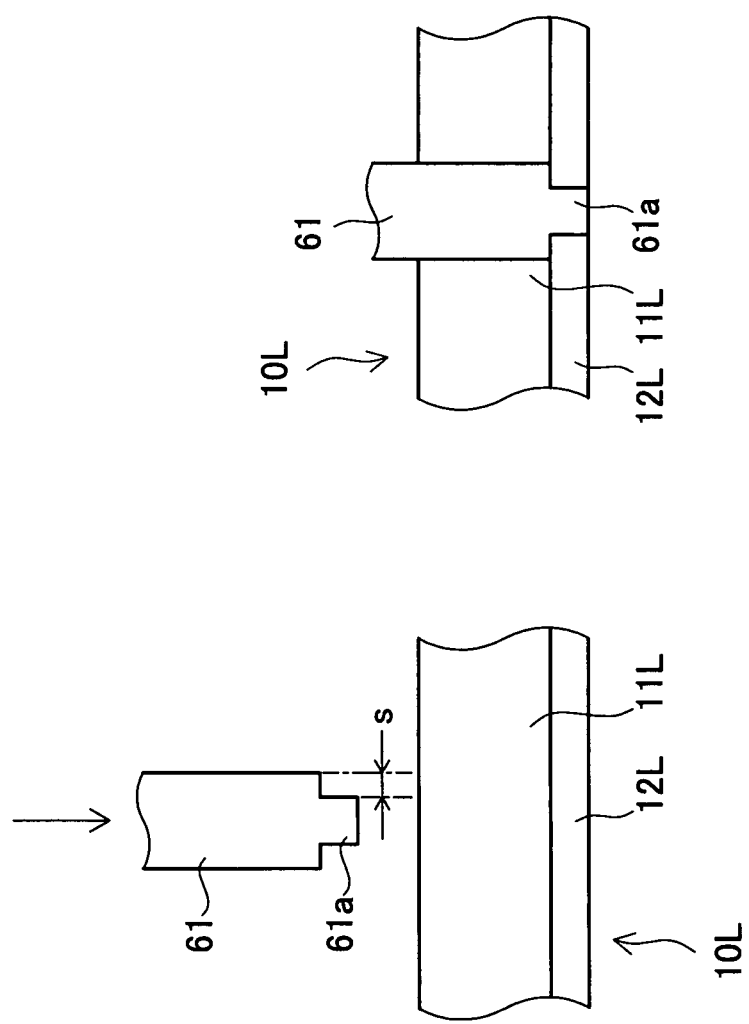

METHOD OF MANUFACTURING A HEAT EXCHANGER

This is a 371 national phase application of PCT/JP2009/057542 filed 8 Apr. 2009, which claims priority to Japanese Patent Application No. 2008-106809 filed 16 Apr. 2008, the contents of which are incorporated herein by reference.

TECHNICAL FIELD

The present invention relates to a method of manufacturing a heat exchanger provided with passages defined by a plurality of fins arranged in parallel, the heat exchanger being configured to allow a refrigerant or cooling medium to pass through the passages to thereby dissipate heat from a heating element. Particularly, the present invention relates to a method of manufacturing a heat exchanger in which passages for allowing a refrigerant to pass are formed by a plurality of fin members constituted of a plurality of parallel fins protruding from a flat base.

BACKGROUND ART

Hybrid electric vehicles or the like incorporate a semiconductor device in an inverter. For cooling the semiconductor device, a water-cooling heat exchanger is adopted. With respect to the inverter mounting the semiconductor device, higher output power has been desired while a reduction in size and weight also has been demanded increasingly. Accordingly, a demand for a heat exchanger superior to a heat dissipation effect has been increased. Patent Literature 1 listed below discloses a conventional heat exchanger having improved cooling capability. FIG. 10 is a sectional plan view of the heat exchanger disclosed in Patent Literature 1.

The heat exchanger 100 includes a plurality of fins 111 defining refrigerant passages in a case 101 formed with a supply port 102 and a discharge port 103. In particular, three fin groups; first, second and third fin groups 201, 202, and 203 are separately provided in a refrigerant flow direction (in a lateral direction in FIG. 10). Each of the fin groups 201, 202, and 203 includes a plurality of fins 111 arranged in a lateral orientation and in parallel with one another. Between the fin groups 201 to 203, merging sections 105 and 106 are formed.

In this heat exchanger 100, the refrigerant will flow from the supply port 102 to the discharge port 103 through straight passages defined by the fins 111, and multiple refrigerant flows join together at the merging sections 105 and 106 to equalize flow distribution and then will diverge into downstream passages. Meanwhile, in the case where the passages defined by the fins 111 are straight, the refrigerant tend to flow in laminar form, which does not easily dissipate the heat conducted through the fins 111, resulting in poor cooling capability. It is therefore conceivable to arrange the fins 111 of the fin groups 201 to 203 so that the fins 111 are offset between upstream and downstream sides in a refrigerant flow direction as shown in Patent Literature 2 for example, thereby causing the refrigerant to impinge on the fins 111 located on the downstream side to disturb the refrigerant flows.

CITATION LIST

Patent Literature

Patent Literature 1: JP2007-335588A
Patent Literature 2: JP2006-080226A

SUMMARY OF INVENTION

Technical Problem

In recent years, a semiconductor device tends to increase heat generating density because of a reduced size. This leads to a demand for improvement of the cooling capability of the heat exchanger to be used in an inverter or the like. Therefore, the configuration in which the fins are arranged in an offset pattern is preferable to improve the cooling capability of the heat exchanger.

However, for such offset arrangement, the fins have to be alternately displaced from each other. The processing operation of such fins is complicated, leading to an increase in manufacturing cost of the heat exchanger. Furthermore, the conventional cooling fins are formed in an offset pattern by casting or the like to constitute a fin member. However, such a fin member is hard to finely machine and thus desired improvement of cooling capability could not be achieved. Also, a product made by casting or the like needs a high processing cost, which results in a high cost of the heat exchanger itself.

The present invention has been made to solve the above problems and has a purpose to provide a method of manufacturing at low cost a heat exchanger including passages defined by fins.

Solution to Problem

To achieve the above problems, the present invention provides a method of manufacturing a heat exchanger comprising a plurality of fin members each including: a flat-plate rectangular base having a predetermined width; and a plurality of fins having the same shape and protruding from the base, the fins being arranged in parallel and in a row in a longitudinal direction of the base so that slit portions with no fin are formed on both side ends of the base in a width direction of the base, the fin members being arranged in a frame through which a refrigerant will flow so that the adjacent bases abut on each other in the width direction, wherein the method comprises producing the fin members by: an extrusion molding operation of extrusion-molding a long fin member in which a plurality of long fins extends in a direction of extruding the long fin member and protrudes from a flat-plate-shaped long base; a fin cutting operation of cutting the long fins of the long fin member, immediately after the extrusion molding operation, by a predetermined width into the fins by a plate-shaped upper die placed perpendicular to the extrusion direction; and a base cutting operation of cutting the long base of the long fin member in a long-fin cutting region made in the fin cutting operation so that the slit portions are formed.

In the above heat exchanger manufacturing method, preferably, the fin cutting operation and the base cutting operation are conducted in two steps, and the fin cutting operation comprises pressing only the long fins of the long fin member having just been made by the extrusion molding operation to cut the long fins at the predetermined width without cutting the long base; and the base cutting operation comprises cutting the long base in the long-fin cutting region made in the fin cutting operation so that the slit portions are formed.

Furthermore, in the above heat exchanger manufacturing method, preferably, the fin cutting operation and the base cutting operation are conducted in a single step in which a plate-shaped upper die placed perpendicular to the extrusion direction of the long fin member made by the extrusion molding, the upper die being formed at a lower end with a protrusion having a narrow width for cutting the long base, and the upper die is brought down toward a lower die contacting a lower surface of the long base to press against the long fin member having just been made by the extrusion molding operation to cut the long fins and the long base simultaneously.

In the above heat exchanger manufacturing method, preferably, each fin member is formed so that the base has end portions protruding by different lengths from the endmost fins in a longitudinal direction of the base, and at least parts of the fin members are alternately oriented in opposite directions in the frame.

Advantageous Effects of Invention

According to the invention, as above, the long fins are cut immediately after the extrusion molding while the material thereof remains soft. The processing operation can therefore be conducted continuously without needing a reheating operation for press processing and hence a reduced processing time can be achieved. Since the fin members can be produced by a simple operation that cuts the long base, thus reducing a processing cost of the fin members, the heat exchanger can be manufactured at low cost. Furthermore, the upper die having the protrusion is used to produce the fin member from the long fin member immediately after the extrusion molding by simultaneously cutting the fins and forming the slit portions. It is therefore possible to further reduce the processing time, leading to a reduced processing cost and manufacturing the heat exchanger at low cost.

BRIEF DESCRIPTION OF DRAWINGS

FIG. 5 is a schematic view showing a fin cutting operation in Example 1;

FIGS. 9A to 9C are side views schematically showing each stage of the cutting operation in Example 2.

DESCRIPTION OF EMBODIMENTS

Examples

Example 1

Figure 1:
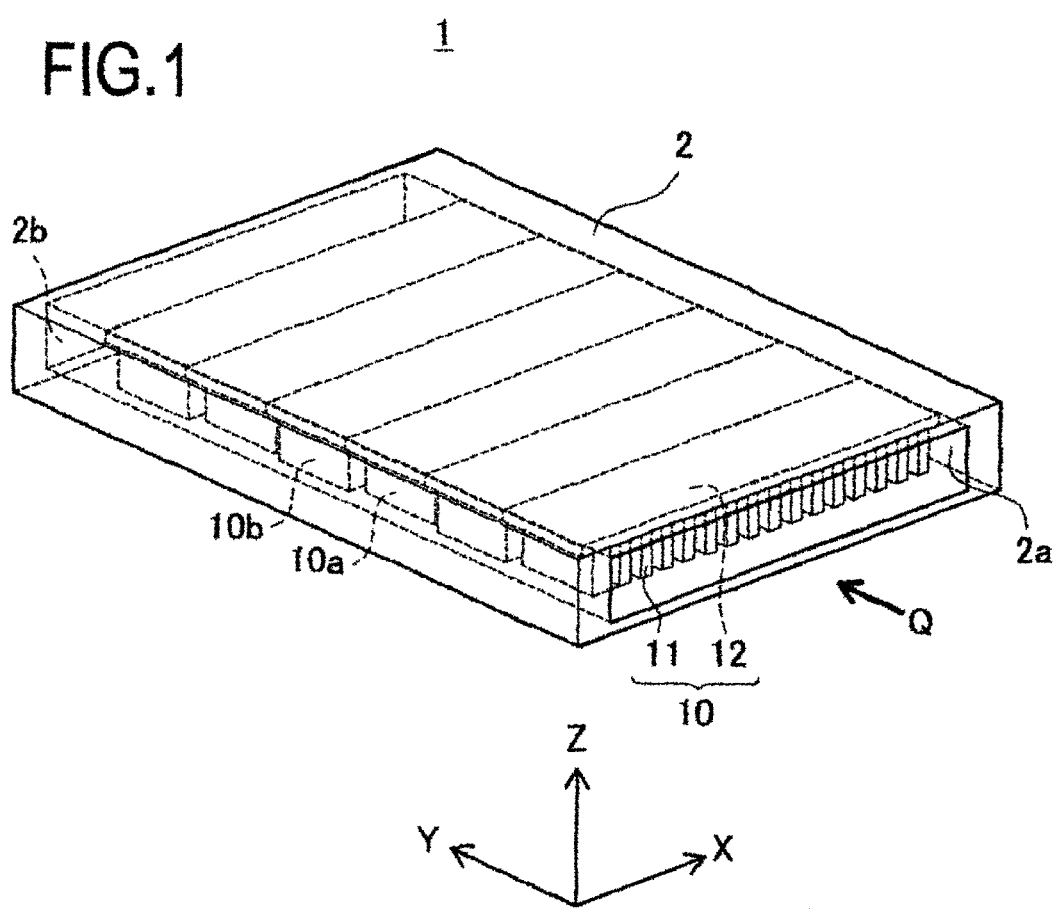
FIG. 1 is a perspective view showing a preferred embodiment of the heat exchanger.

A detailed description of a preferred embodiment of a heat exchanger manufacturing method according to the present invention will now be given referring to the accompanying drawings. FIG. 1 is a perspective view of a heat exchanger to be manufactured by the method of the present embodiment.

A heat exchanger 1 includes a plurality of fin members 10 each of which is constituted of a plurality of fins 11. The fin members 10 are incorporated in a frame 2 so that the fins 11 are arranged to form a plurality of passages through which a refrigerant is allowed to pass. The frame 2 forming a main body of the heat exchanger 1 is a tubular shape having an inlet-side opening 2a and an outlet-side opening 2b which open at both ends in a direction Y in the figure. In the frame 2, the refrigerant is allowed to flow in a direction indicated by an arrow Q for example. The frame 2 has a vertical section having a flat rectangular shape oblong in an X direction in FIG. 1 perpendicular to the refrigerant flow direction.

In the heat exchanger 1 shown in FIG. 1, the inlet-side opening 2a and the outlet-side opening 2b largely open on either side of the frame 2. During use, on the other hand, the openings 2a and 2b are closed and connected respectively to a refrigerant supply pipe and a refrigerant discharge pipe, both of which are not shown. The refrigerant supply pipe is connected to a supply pump for pumping a refrigerant at a constant pressure to the heat exchanger 1 and the refrigerant discharge pipe is connected to a tank for collecting the refrigerant discharged from the heat exchanger 1.

In the heat exchanger 1, the plurality of fin members 10 are arranged in the frame 2 to form the passages. Herein, FIG. 2 is a sectional view of the heat exchanger 1 of FIG. 1 viewed from below and FIG. 3 is a perspective view of one of the fin members 10.

Figure 3:
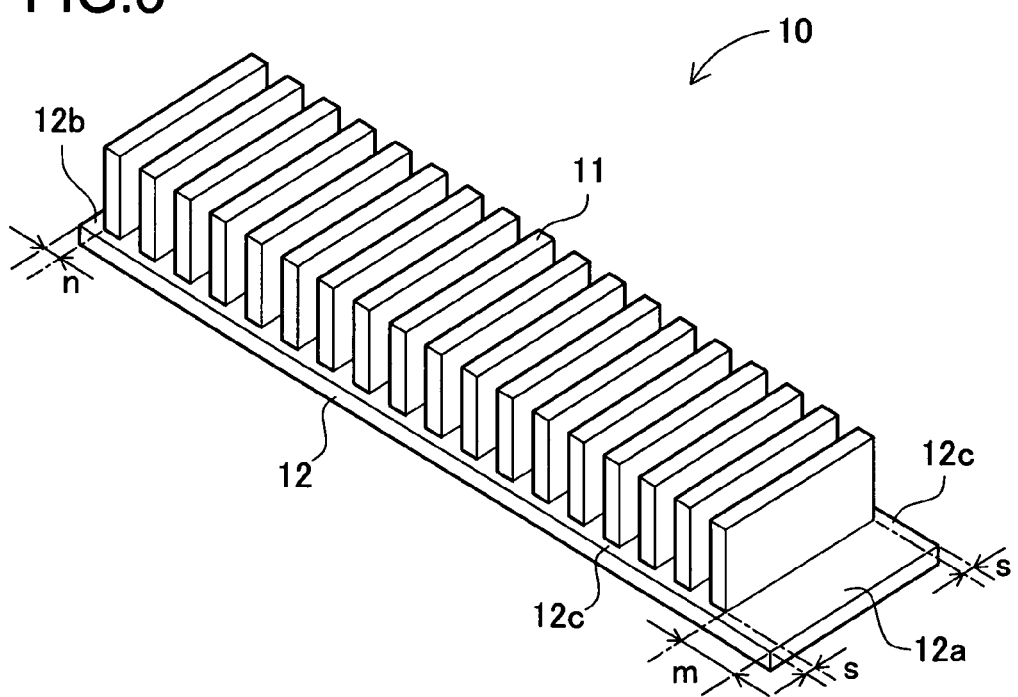
FIG. 3 is a perspective view showing a fin member constituting the heat exchanger.

As shown in FIG. 3, each fin member 10 includes the plurality of fins 11 formed to protrude from a base 12 made of a rectangular flat plate. The fins 11 are formed vertical to the base 12 and arranged in a row in a longitudinal direction of the base 12 so that adjacent fins 11 are spaced at fixed intervals in parallel with one another.

The base 12 has end portions 12a and 12b extending by respective lengths "m" and "n" from the endmost fins 11 in the longitudinal direction of the base 12 so that the length "m" of the end portion 12a is longer than the length "n" of the end portion 12b (m>n). On the other hand, a size (width) of the base 12 in a short-side direction is longer than the width of each fin 11 to provide slit portions 12c each having a width "s" on each side end of the base 12. A height between the lower surface of the base 12 to the top surface of each fin 11 and a length of the base 12 in the longitudinal direction are determined according to a size (sizes in the directions Z and X in FIG. 1) of the internal space of the frame 2. In this frame 2, the fin members 10 are inserted and incorporated as shown in FIGS. 1 and 2.

Figure 2:
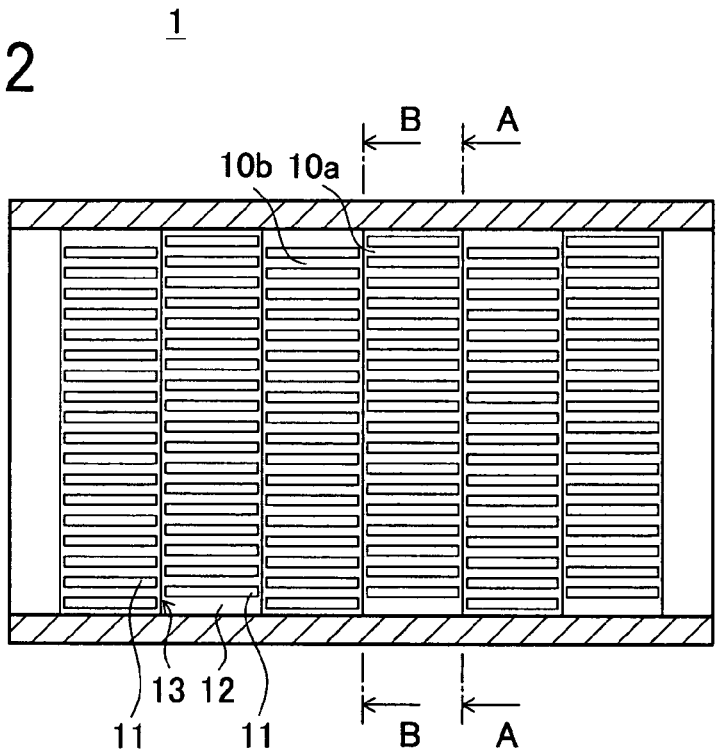
FIG. 2 is a sectional view of the heat exchanger of FIG. 1, viewed from below.
Figure 4A:
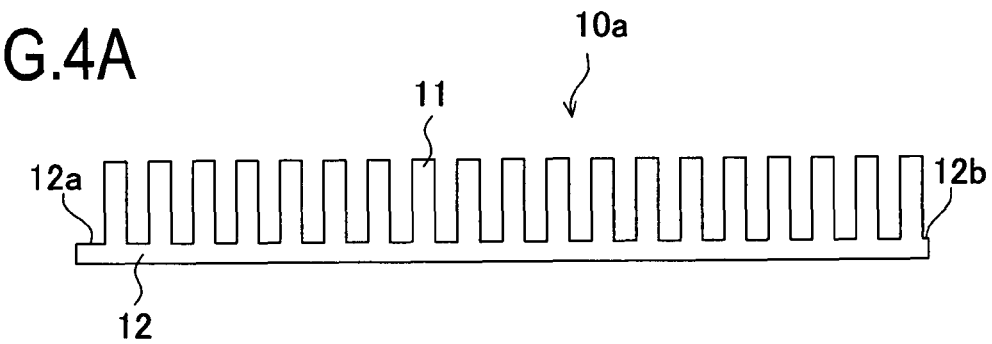
FIG. 4A is a side view of the fin member taken along a line A-A in FIG. 2.
Figure 4B:
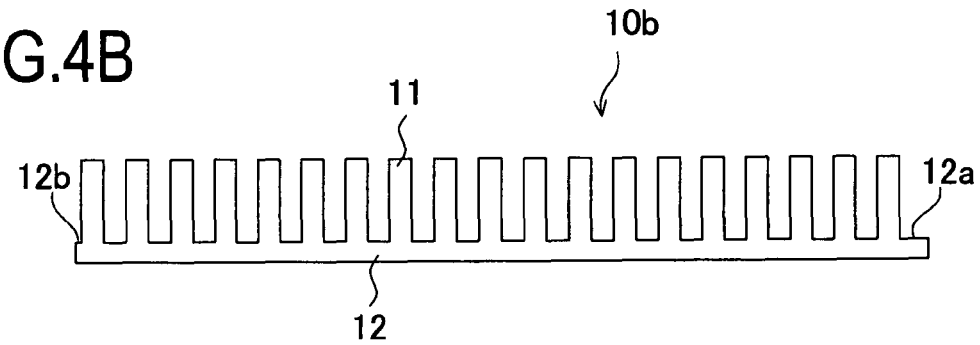
FIG. 4B is a side view of the fin member taken along a line B-B in FIG. 2.

Herein, FIG. 4A is a side view showing one fin member 10a viewed along a line A-A in FIG. 2 and FIG. 4B is a side view showing another fin member 10b viewed along a line B-B in FIG. 2. In the heat exchanger 1, such fin members 10a and 10b are alternately placed to form the passages through which a refrigerant will flow. In other words, the fins 11 of the fin members 10a and the fins 11 of the fin members 10b are placed in an offset pattern, thereby forming offset passages. Accordingly, the refrigerant will impinge on the downstream fins 11 every time the refrigerant flows from the passages of the fin members 10a to those of the fin members 10b or vice versa. It is to be noted that all the fin members 10a and 10b are the fin members 10 shown in FIG. 3 and the fin members 10a and the fin members 10b are merely oriented in opposite directions in FIGS. 4A and 4B.

The fin members 10a and 10b incorporated in the frame 2 are placed so that adjacent bases 12 abut on each other as shown in FIG. 2. In this state, the fins 11 of the adjacent fin members 10a and 10b are spaced by the slit portions 12c (see FIG. 3) of the adjacent bases 12, thereby forming a slit 13 extending in a direction perpendicular to the refrigerant flow direction, i.e., in a vertical direction in FIG. 2. This is to allow the refrigerant to flow via the slit 13 without being interrupted by the offset fins 11 located on a downstream side.

Next, an explanation will be given to the method of manufacturing the fin members 10 forming the passages of the heat exchanger 1. FIG. 5 is a schematic view showing a fin cutting operation for cutting a long fin.

The fin member 10 is made of a material having a high heat transfer coefficient such as aluminum. Specifically, the material (aluminum) in a molten state is extrusion-molded by a molding die for forming the plurality of fins 11 and the base 12 to produce a long fin member 10L having a length of several meters, for example. In this way, the long fin member 10L is first produced and then cut into pieces as the fin members 10 each having a fixed width.

Immediately after the extrusion molding, the long fin member 10L is directly fed to a press machine shown in FIG. 5 and subjected to a fin cutting operation. Specifically, the long fin member 10L with long fins 11L extending in parallel in an extrusion direction F and vertically protruding from a long base 12L is fed forward in the extrusion direction F shown in the figure. The long fin member 10L having just been extrusion-molded remains soft and hot to some extent. Only the long fins 11L are cut by the press machine 50. This press machine 50 includes a lower die not shown for supporting the long base 12L from below and a plate-like upper die 51 which will be placed in an orientation perpendicular to the extrusion direction F. The upper die 51 will be brought down toward the lower die.

In this press machine 50, the upper die 51 is a flat plate having a fixed thickness and a flat lower end. Furthermore, a pair of fin retainers 53 is placed on both sides of the upper die 51 to prevent the fins 11 and the long fins 11L from buckling or tilting due to a pressing force of the upper die 51. Each of the fin retainers 53 includes a plurality of plate-shaped support teeth 55 which will be inserted between the fins 11 or the long fins 11L individually.

To produce the fin members 10, the long fin member 10L is first made by the extrusion molding and then fed in the extrusion direction F to the press machine 50 and others placed forward in the direction F. The fin members 10 are thereby produced consecutively. To be more concrete, the long fin member 10L fed forward is subjected to a fin cutting operation to cut the long fins 11L. In this cutting operation, the long fin member 10L is temporarily stopped and the support teeth 55 of the fin retainers 53 are inserted in gaps between the long fins 11L to support each long fin 11L from both sides thereof. In this state, the upper die 51 is brought down to vertically press against parts of the long fins 11L, thereby cutting the long fins 11L into the fins 11 as shown in the figure. At that time, the long base 12L remains uncut. Accordingly, many groups of the fins 11 divided by slits 13X made as long-fin cutting regions are formed on the long base 12L.

The long fin member 10L is then fed to a base cutting operation not shown to cut the long base 12L. Although a device used in the base cutting operation is not shown herein, the long fin member 10L fed thereto is subjected to cutting to cut the long base 12L by a cutter that moves along a broken line C perpendicular to the extrusion direction F in FIG. 5, thereby cutting away the fin member 10. At that time, the cutter passes through the center of the slit 13X to cut the long base 12L. Accordingly, the produced fin member 10 has the slit portions 12c each having the width "s" shown in FIG. 3.

Figure 6:
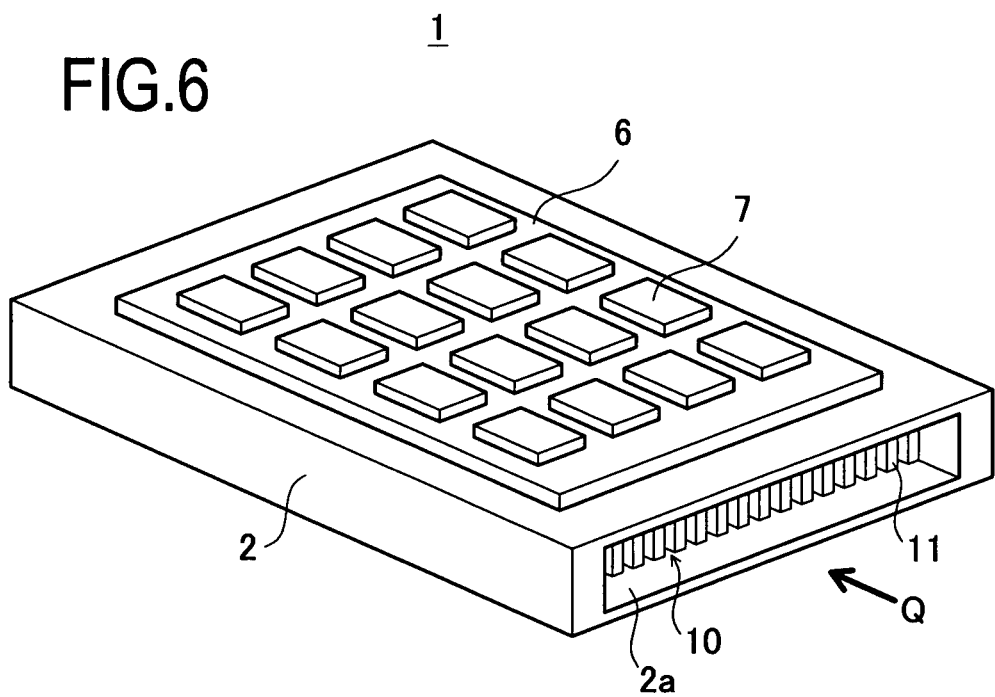
FIG. 6 is a perspective view showing a use state of the heat exchanger in Example 1.

The plurality of fin members 10 produced as above are oriented as the fin members 10a and 10b in opposite directions as shown in FIGS. 4A and 4B and inserted in the frame 2 so that the fin members 10a and 10b are alternately placed as shown in FIGS. 1 and 2. The adjacent fin members 10a and 10b are placed with respective bases 12 abutting on each other and integrally fixed to the frame 2 with unillustrated fastening members or the like. The heat exchanger 1 is thus manufactured. In this heat exchanger 1, as shown in FIG. 6, a heat spreader 6 for heat dissipation is adhered to the frame 2. A plurality of semiconductor devices 7 which are heating elements are adhered in a predetermined pattern on the heat spreader 6.

When the semiconductor devices 7 used in the inverter or the like generate heat, the heat is dissipated by the heat spreader 6 and further conducted to the fin members 10 placed in the frame 2. In the frame 2, the refrigerant is supplied through the inlet-side opening 2a and flows toward the outlet-side opening 2b. Accordingly, the heat conducted to the fins 11 is absorbed by the refrigerant flowing in contact with the fins 11.

In the heat exchanger 1 manufactured in the present embodiment, the refrigerant flowing between the fins 11 is continually disturbed by the fin members 10a and 10b alternately placed in a refrigerant flowing direction. Thus, the refrigerant will flow downstream in a turbulent form while efficiently absorbing the heat from the fins 11. In this embodiment, furthermore, the heat exchanger 1 having the fins 11 placed in an offset pattern is constituted by the fin members 10 all of which have the same shape. This enables a reduction in the number of components or parts, resulting in a reduced cost.

In the aforementioned manufacturing method of the heat exchanger 1, the long fin member 10L having just been made by the extrusion molding is subjected to cutting to cut the long fins 11L by the press machine 50, thereby forming the slits 13X, and then to cut the long base 12L by the cutter so as to leave the slit portions 12c on both side ends of the base 12 in the width direction. Thus, the fin members 10 are produced by the above simple operations. Accordingly, the method of this embodiment can produce a number of fin members 10 in shorter time as compared with conventional casting. In particular, the slits 13X are made while the material of the fin members 10 remains soft immediately after the extrusion molding. Accordingly, the processing operation is conducted continuously without needing a reheating operation for press processing, thus enabling a reduced processing time. Therefore, the production cost of the fin members 10 can be reduced and hence the heat exchanger 1 can be provided at low cost.

Figure 7:
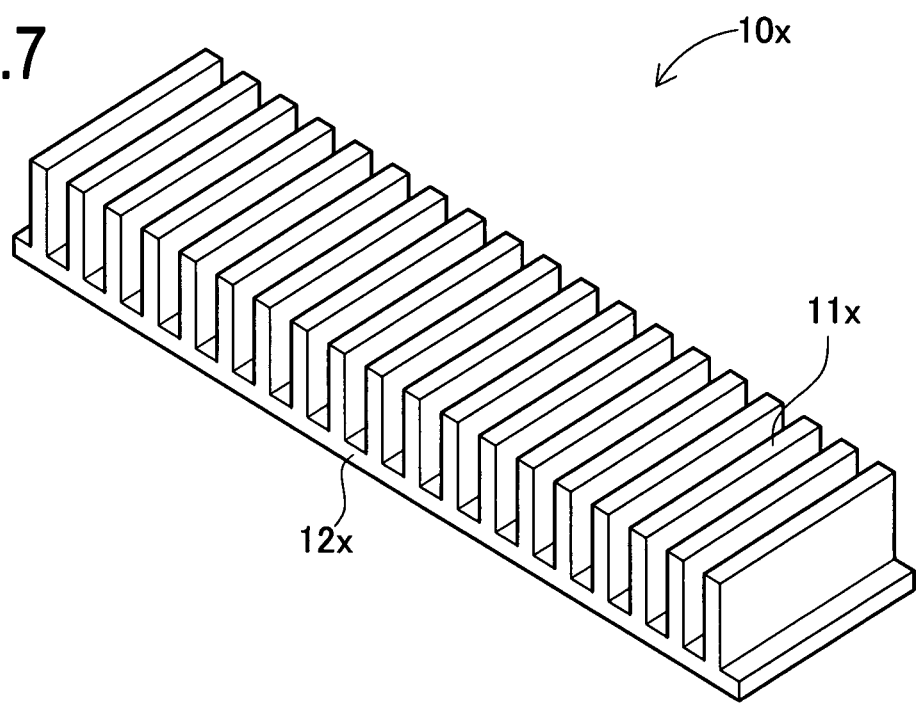
FIG. 7 is a perspective view of a cut piece obtained by cutting a long fin member according to a method different from the embodiment.

The fin members 10 need the slit portions 12c. However, initially the long fin member 10L was cut to first produce a short fin member 10x as shown in FIG. 7. This short fin member 10x was then subjected a milling work or the like as a later operation to trim or partly cut away both side end portions of each fin 11x in a direction of the width (the short side) of a base 12x to form slit portions. However, the manufacturing method needing such trimming or cutting would require a complicated operation, taking much time for trimming or cutting and causing an increase in production cost of the fin members 10, thus leading to an increase in cost of the heat exchanger 1 itself. In the present embodiment, therefore, the slits 13X are made by press processing (fin cutting operation) and the slit portions 12c are formed in the subsequent cutting operation (base cutting operation). Accordingly, processing can be made simple and the processing time can be reduced largely.

Example 2

Figure 8:
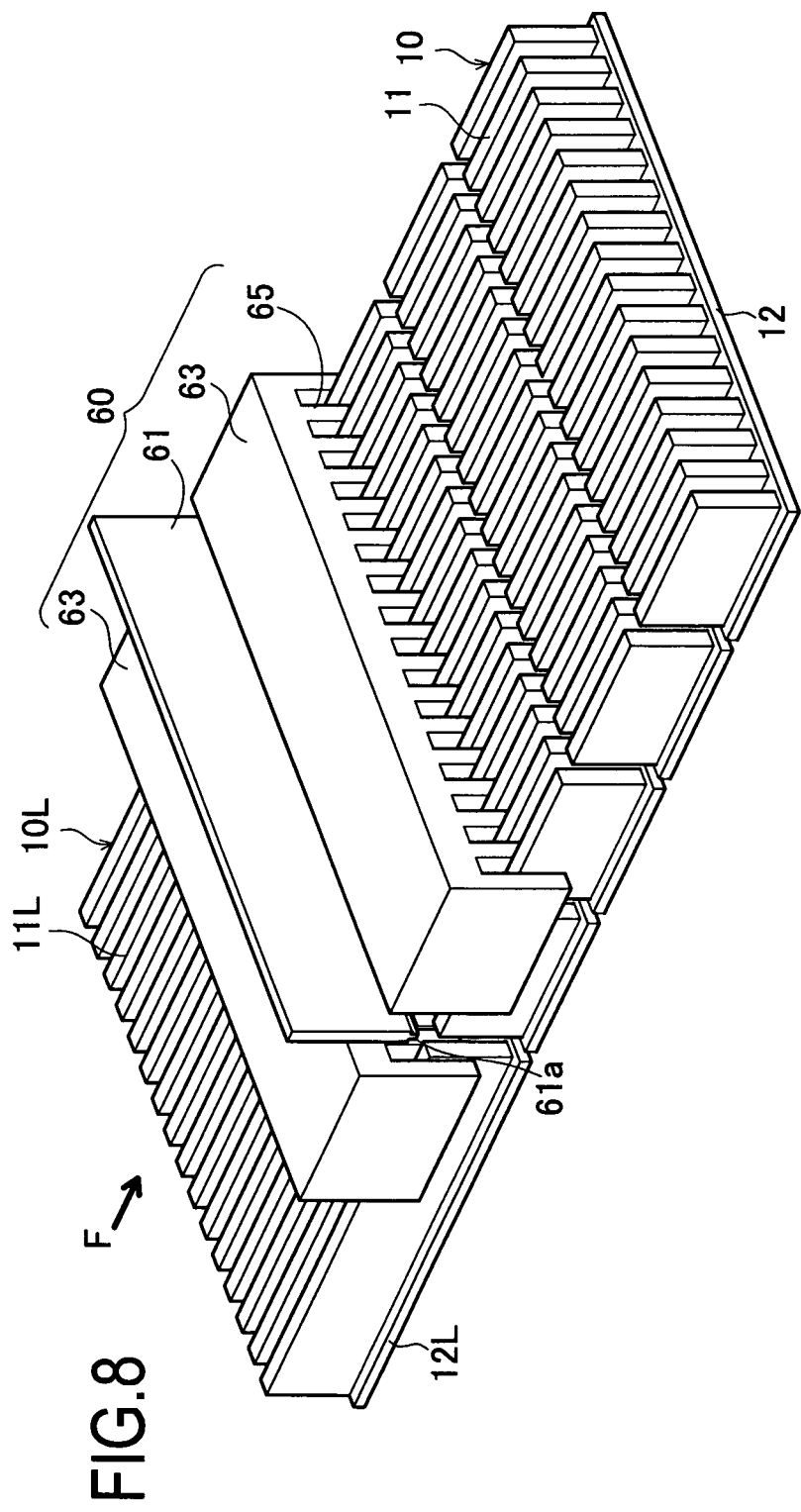
FIG. 8 is a schematic view showing a cutting operation in Example 2.
Figure 10:
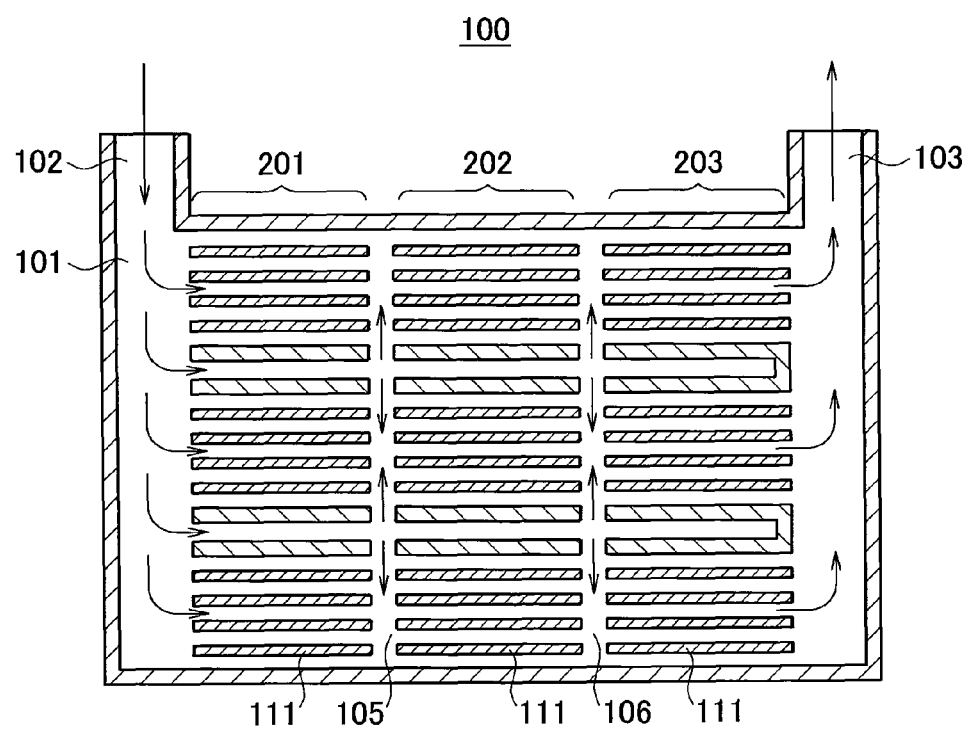
FIG. 10 is a sectional plan view showing a conventional heat exchanger.

Example 2 of the method of manufacturing the heat exchanger 1 will be explained below. In particular, an explanation will be given to the manufacturing method of the fin members 10 forming the passages of the heat exchanger 1. FIG. 8 is a schematic view showing a processing operation of the fin members 10. FIGS. 9A, 9B, and 9C are schematic side views showing each stage of the processing operation.

For producing the fin members 10, extrusion molding is conducted also in this example. Specifically, a material for the fin members 10 such as aluminum in a molten state is extruded from a molding die to form a long fin member 10L as shown in FIG. 8. In this example, each fin member 10 is produced from the long fin member 10L in the following one step.

The long fin member 10L is fed in the extrusion direction F as shown in FIG. 8 while the long fins 11L are arranged in parallel with each other and vertically protruding from the long base 12L placed under the fins 11L. At that time, the just-molded long fin member 10L remains soft and hot to some extent. In this example, the long fins 11L and the long base 12L of such long fin member 10L are cut simultaneously. A press machine 60 includes an unillustrated lower die supporting the base 12 from below and a plate-shaped upper die 61 that is placed perpendicular to the extrusion direction F and will be brought down toward the lower die.

The press machine 60 is adapted to bring down the upper die 61 onto the lower die to simultaneously cut the long fins 11L and the long base 12L at different widths. The upper die 61 is a flat plate formed with a protrusion 61a at a lower end as shown in FIG. 9A. This protrusion 61a has a narrower width (thickness) than a plate-shaped main body of the upper die 61 to provide shoulders each having a width "s" on both edges of the main body of the upper die 61 in a thickness direction. Each of those shoulders will form the slit portion 12c of the fin member 10 as shown in FIG. 3. The press machine 60 is further provided with a pair of fin retainers 63 placed on both sides of the upper die 61 in order to prevent the fins 11 and the long fins 11L from buckling due to a pressing force of the upper die 61. Each of the fin retainers 63 is formed with a plurality of plate-shaped support teeth 65 which will be inserted between the fins 11 or the long fins 11L individually.

To produce the fin members 10, the long fin member 10L is first made by the extrusion molding and then fed in the extrusion direction F to the press machine 60 placed forward in the direction F. The fin members 10 are thereby produced consecutively. To be more concrete, the long fin member 10L fed forward is stopped at predetermined time intervals and subjected to the processing operation shown in FIGS. 9A to 9C. With respect to the stopped long fin member 10L, the support teeth 65 of the fin retainers 63 are inserted in gaps between the long fins 11L to support each long fin 11L is supported from both sides thereof.

In this state, the upper die 61 is brought down to vertically press against parts of the long fins 11L until the protrusion 61a at the lower end of the upper die 61 is pressed onto the unillustrated lower die that contacts with the lower surface of the long base 12L, thereby cutting the long base 12L by the width (thickness) of the protrusion 61a as shown in FIG. 9B. The upper die 61 is thereafter moved upward. Thus, one fin member 10 is cut away from the long fin member 10L as shown in FIG. 9C. As above, the fin members 10 are produced from the long fin member 10L by the press machine 60 and then incorporated in the frame as shown in Example 1 to constitute the passages of the heat exchanger 1.

According to the manufacturing method of the heat exchanger 1 manufactured in the present embodiment, consequently, from the long fin member 10L having just been extrusion-molded, the fin members 10 can be produced in a single press operation by the press machine 60. In other words, the formation of the slit portions 12c and the cutting of the long fin 11L can be conducted at the same time by the upper die 61 having the protrusion 61a. It is therefore possible to further reduce the number of processing operations as compared with Example 1 and thus shorten the processing time. This makes it possible to achieve a reduced production cost of the fin members 10 and consequently provide the heat exchanger 1 at low cost.

As above, the present invention is explained based on the preferred embodiment but it may be embodied in other specific forms without departing from the essential characteristics thereof.

REFERENCE SIGNS

1 Heat exchanger
2 Frame
10 (10a, 10b) Fin member
11 Fin
12 Base
13 Slit
50 Press machine
51 Upper die
53 Fin retainer
12c Slit portion
10L Long fin member
11L Long fin
12L Long base
13X Slit

The invention claimed is:

1. A method of manufacturing a heat exchanger comprising a plurality of fin members each including:
    a flat-plate rectangular base having a predetermined width; and
    a plurality of fins having the same shape and protruding from the base, the fins being arranged in parallel and in a row in a longitudinal direction of the base so that slit portions with no fin are formed on both side ends of the base in a width direction of the base,
    the fin members being arranged in a frame through which a refrigerant will flow so that the adjacent bases abut on each other in the width direction,
    wherein the method comprises producing the fin members by:
    an extrusion molding operation of extrusion-molding a long fin member in which a plurality of long fins extends in a direction of extruding the long fin member and protrudes from a flat-plate-shaped long base;
    a fin cutting operation of cutting the long fins of the long fin member, immediately after the extrusion molding operation, by a predetermined width into the fins by a plate-shaped upper die placed perpendicular to the extrusion direction; and
    a base cutting operation of cutting the long base of the long fin member in a long-fin cutting region made in the fin cutting operation so that the slit portions are formed,
    each fin member is formed so that the base has both end portions protruding by different lengths from the endmost fins in a longitudinal direction of the base,
    at least parts of the fin members are alternately oriented in opposite directions in the frame; and both end portions of the base are placed in contact with the frame to provide passages at both ends to allow the refrigerant to flow near a wall surface of the frame.

2. The method of manufacturing a heat exchanger according to claim 1, wherein the fin cutting operation and the base cutting operation are conducted in two steps, and the fin cutting operation comprises pressing only the long fins of the long fin member having just been made by the extrusion molding operation to cut the long fins at the predetermined width without cutting the long base; and the base cutting operation comprises cutting the long base in the long-fin cutting region made in the fin cutting operation so that the slit portions are formed.

3. The method of manufacturing a heat exchanger according to claim 1, wherein the fin cutting operation and the base cutting operation are conducted in a single step in which the plate-shaped upper die placed perpendicular to the extrusion direction of the long fin member made by the extrusion molding, the upper die being formed at a lower end with a protrusion having a narrow width for cutting the long base, and the upper die is brought down toward a lower die contacting a lower surface of the long base to press against the long fin member having just been made by the extrusion molding operation to cut the long fins and the long base simultaneously.

4. The method of manufacturing a heat exchanger according to claim 1, wherein a length of the base in the longitudinal direction is determined according to a size of the internal space of the frame.

5. The method of manufacturing a heat exchanger according to claim 4, wherein the fin cutting operation and the base cutting operation are conducted in two steps, and the fin cutting operation comprises pressing only the long fins of the long fin member having just been made by the extrusion molding operation to cut the long fins at the predetermined width without cutting the long base; and the base cutting operation comprises cutting the long base in the long-fin cutting region made in the fin cutting operation so that the slit portions are formed.

6. The method of manufacturing a heat exchanger according to claim 4, wherein the fin cutting operation and the base cutting operation are conducted in a single step in which the plate-shaped upper die placed perpendicular to the extrusion direction of the long fin member made by the extrusion molding, the upper die being formed at a lower end with a protrusion having a narrow width for cutting the long base, and the upper die is brought down toward a lower die contacting a lower surface of the long base to press against the long fin member having just been made by the extrusion molding operation to cut the long fins and the long base simultaneously.

* * * * *